United States Patent
Teng et al.

(10) Patent No.: US 12,368,281 B2
(45) Date of Patent: Jul. 22, 2025

(54) SYSTEM AND METHOD FOR OPTICAL FEEDBACK STABILIZED SEMICONDUCTOR FREQUENCY COMBS

(71) Applicant: The Trustees of Princeton University, Princeton, NJ (US)

(72) Inventors: Chu C. Teng, Edison, NJ (US); Jonas Westberg, Princeton, NJ (US); Gerard Wysocki, Princeton, NJ (US)

(73) Assignee: THE TRUSTEES OF PRINCETON UNIVERSITY, Princeton, NJ (US)

( * ) Notice: Subject to any disclaimer, the term of this patent is extended or adjusted under 35 U.S.C. 154(b) by 94 days.

(21) Appl. No.: 17/245,242

(22) Filed: Apr. 30, 2021

(65) Prior Publication Data

US 2021/0344167 A1 Nov. 4, 2021

Related U.S. Application Data

(60) Provisional application No. 63/018,586, filed on May 1, 2020.

(51) Int. Cl.
*H01S 5/34* (2006.01)
*H01S 5/0687* (2006.01)
*H01S 5/14* (2006.01)

(52) U.S. Cl.
CPC .............. *H01S 5/0687* (2013.01); *H01S 5/14* (2013.01); *H01S 5/3402* (2013.01); *H01S 5/3401* (2013.01)

(58) Field of Classification Search
CPC .... H01S 5/3401; H01S 5/3402; H01S 5/0687; H01S 5/14
See application file for complete search history.

(56) References Cited

U.S. PATENT DOCUMENTS

| 6,320,889 | B1* | 11/2001 | MacKinnon | H01S 3/08 372/32 |
| 2013/0121362 | A1* | 5/2013 | Kub | H01S 3/0813 372/50.22 |
| 2014/0300963 | A1* | 10/2014 | Yahagi | G02B 27/281 359/484.03 |
| 2017/0302056 | A1* | 10/2017 | Fritsche | H01S 5/3404 |
| 2019/0052054 | A1* | 2/2019 | Happach | H01S 5/1021 |
| 2021/0006038 | A1* | 1/2021 | Hillbrand | H01S 3/101 |

FOREIGN PATENT DOCUMENTS

CN 110649462 A * 1/2020 ........... H01S 5/0687

OTHER PUBLICATIONS

English Translation of CN 110649462 (Year: 2020).*

(Continued)

*Primary Examiner* — Minsun O Harvey
*Assistant Examiner* — Stephen Sutton Kotter
(74) *Attorney, Agent, or Firm* — MEAGHER EMANUEL LAKS GOLDBERG & LIAO, LLO

(57) ABSTRACT

According to various embodiments, a system for stabilizing operation of semiconductor laser frequency combs via optical feedback is disclosed. The system includes an external cavity having a beam-splitter, polarizer, and mirror or partially reflective element mounted on a translational stage. The external cavity and a laser facet of the semiconductor laser form an external optical resonator for coupling light to a laser cavity.

14 Claims, 6 Drawing Sheets

(56) References Cited

OTHER PUBLICATIONS

J. L. Hall, "Nobel Lecture: Defining and measuring optical frequencies," Rev. Mod. Phys. vol. 78, No. 4, 1279-1295, Oct.-Dec. 2006.
D. J. Jones, et al., "Carrier-Envelope Phase Control of Femtosecond Mode-Locked Lasers and Direct Optical Frequency Synthesis". Science, vol. 288 (5466), 635-639, Apr. 28, 2000.
A. Hugi, et al., "Mid-infrared frequency comb based on a quantum cascade laser", Nature, vol. 492 (7428), 229-233 Dec. 13, 2012.
M. Bagheri, et al., "Passively mode-locked interband cascade optical frequency combs", Sci. Rep. 8:3322, 1- 7, 2018.
G. Villares, et al., "Dispersion engineering of quantum cascade laser frequency combs", Optica, vol. 3, No. 3, 252-258. Mar. 2016.
Y. Bidaux, et al., "Plasmon-enhanced waveguide for dispersion compensation in mid-infrared quantum cascade laser frequency combs", Opt. Lett., vol. 42, No. 8, 1604-1607, Apr. 15, 2017.
Y. Bidaux, et al., "Coupled-Waveguides for Dispersion Compensation in Semiconductor Lasers", Laser Photonics Rev., 12, 1700323, 2018.
D. Burghoff, et al., "Terahertz laser frequency combs", Nat. Photonics, vol. 8, 462-467, Jun. 2014.
J. Hillbrand, et al., "Coherent injection locking of quantum cascade laser frequency combs", ArXiv180806636 Phys., 1-5, Aug. 20, 2018.

\* cited by examiner

SYSTEM AND METHOD FOR OPTICAL FEEDBACK STABILIZED SEMICONDUCTOR FREQUENCY COMBS

CROSS-REFERENCE TO RELATED APPLICATIONS

This application claims priority to provisional application 63/018,586, filed May 1, 2020, which is herein incorporated by reference in its entirety. This application is also related to provisional application 62/843,104, filed May 3, 2019, which is herein incorporated by reference in its entirety.

FIELD OF THE INVENTION

The present invention relates generally to frequency combs and, more particularly, to a system and method for improving the stability of a frequency comb by optical feedback.

BACKGROUND OF THE INVENTION

Optical frequency combs (OFCs) have become essential tools for accurate optical frequency referencing or for spectroscopic applications that require highly coherent broadband light sources. Traditionally, OFCs have been based on optically pumped mode-locked fiber lasers with stabilization schemes that allow for long coherence times and low phase noise. However, these systems are often complex and costly, which has so far limited their use to controlled laboratory environments.

An alternative is provided by semiconductor laser frequency combs, where the comb emission is generated directly by a chip-scale semiconductor laser, whose wavelength can be engineered by careful control of the layered semiconductor growth process. Several advantages accompany this solution: (i) the combs can be produced by modern semiconductor fabrication technology, which enables full scalability of the manufacturing process; (ii) the devices are of chip-scale size allowing for miniaturization of the systems; and (iii) the devices are electronically pumped and highly energy-efficient, which opens for autonomous, battery-powered implementations.

However, a major hurdle for semiconductor laser frequency combs is the non-negligible cavity dispersion associated with these devices. This is an unwanted property of the materials and waveguides that can prevent comb formation. This issue has been well-known ever since the first demonstration of these comb sources and several methods to address this problem have been put forward. The basic principle of these dispersion engineering methods is to characterize the dispersion and compensate the dispersion by altering the waveguide geometry, the cavity losses, or adding a coating to one of the laser facets. Although these techniques have been shown to be effective, specific and often time-consuming fabrication configurations must be implemented for each device, which require fine-tuning and, in many cases, need to be applied manually to each device. Another approach to solve this problem is to inject a low phase-noise radio frequency (rf) signal directly to the devices, a technique commonly referred to as rf injection locking. However, the frequency of the rf signal needs to be closely matched (within 100 kHz) to the round-trip frequency of the laser. Relatively high powers (>10 dBm) are also required. If successful, the intermode beat note of the laser is locked to the injected low noise rf signal and stable comb operation is achieved. The drawback of this approach is the requirement of a low-phase noise rf signal generator capable of frequencies up to 20 GHz, which inevitably adds complexity and cost to the system. Furthermore, the injected frequency needs to be tuned to within ~100 kHz of the intermode beat note, which limits the usefulness of this technique whenever the lasers are stepped or tuned in frequency.

As such, there is a need for semiconductor frequency combs that address at least some of the above issues.

SUMMARY OF THE INVENTION

According to various embodiments, a system for stabilizing operation of semiconductor laser frequency combs is disclosed. The system includes an external cavity having a beam-splitter, polarizer, and mirror mounted on a translational stage. The system also includes a laser facet. The external cavity and laser facet form an external optical resonator for coupling to a laser cavity.

According to various embodiments, a system for stabilizing operation of semiconductor laser frequency combs is disclosed. The system includes an external cavity having at least one partially reflective surface. The system also includes a laser facet. The external cavity and laser facet form an external optical resonator for coupling to a laser cavity.

According to various embodiments, a method for stabilizing operation of semiconductor laser frequency combs is disclosed. The method includes providing an external cavity having at least one partially reflective surface and providing a laser facet. The external cavity and laser facet forming an external optical resonator for coupling to a laser cavity.

Various other features and advantages will be made apparent from the following detailed description and the drawings.

BRIEF DESCRIPTION OF THE DRAWINGS

In order for the advantages of the invention to be readily understood, a more particular description of the invention briefly described above will be rendered by reference to specific embodiments that are illustrated in the appended drawings. Understanding that these drawings depict only exemplary embodiments of the invention and are not, therefore, to be considered to be limiting its scope, the invention will be described and explained with additional specificity and detail through the use of the accompanying drawings, in which.

DETAILED DESCRIPTION OF THE INVENTION

Figure 1A:
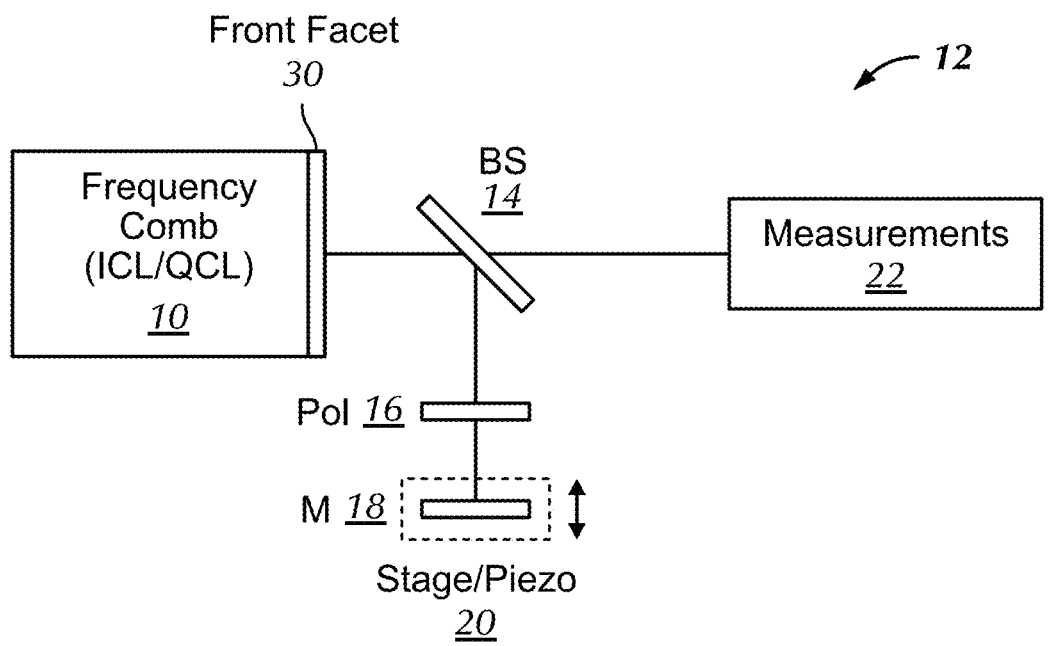
FIG. 1(a) depicts a diagram of frequency comb operation with controlled optical feedback allowing for fine control of feedback power according to an embodiment of the present invention.

Generally disclosed herein are embodiments for a system and method to extend the operating range of semiconductor laser frequency combs by means of external optical feedback. An external cavity is constructed by adding at least one partially reflective surface to the configuration, which, together with a laser facet, forms an external optical resonator that is coupled to the laser cavity. Under the right external cavity conditions (for example, the cavity length can be ~10 cm and the feedback intensity can be 0.1%-1%), this strongly favors low phase-noise operation of the semiconductor laser frequency comb, which stabilizes frequency comb operation and allows access to bias and temperature regions previously prone to high phase noise. The external cavity can be miniaturized and incorporated into a laser mount or provided as an accessory to an already packaged laser. This solution circumvents the need for extensive characterization of devices followed by intricate dispersion compensation schemes and can be applied to any semiconductor laser frequency comb, e.g., quantum cascade lasers, interband cascade lasers, or diode lasers.

The embodiments generally disclosed herein expand the comb operating range of semiconductor laser frequency combs. By optically re-injecting light that has been filtered and conditioned by an external cavity, the laser strongly favors low noise comb operation, which enables use under bias and temperature conditions that normally shows high phase noise behavior. Although the disclosed embodiments rely on the addition of an external cavity element to a semiconductor comb, it differs from dispersion compensation techniques such as that using a Gires-Tournois interferometer (GTI). Incorporation of a GTI on a laser device requires precise deposition of layers of dielectric materials and a highly reflective gold layer, which is labor intensive both in its configuration, fabrication, and optimization. In contrast, embodiments of the disclosed optical injection technique allow flexible choice of the external cavity elements as well as length of the external cavity that will allow for simpler manufacturing as well as use of cavity elements that provide additional dispersion compensation (e.g., via tailored selection of optical coatings, or use of diffractive cavity elements). The following parameters of the external cavity used for comb stabilization are characteristic to the embodiments disclosed herein.

(1) Cavity length is usually on the order of cm to 10s of cm determined by the maximum dispersion of the laser device and the laser facet reflectivity.

(2) The external cavity is resonant with the laser device cavity. In other words, the free spectral range (FSR) of the laser cavity should be an integer multiple of the FSR of the external cavity.

(3) Single or multiple external cavity elements can be used including dielectric and/or metallic mirrors, lenses, diffraction gratings, prisms, and polarization optics, as nonlimiting examples. The parameters of external elements (e.g., diffraction grating groove density, multi-layer dielectric mirror coatings) can be tailored to provide compensation of effective cavity dispersion.

(4) Opto-mechanical, electro-optical, or acousto-optical tuning of cavity parameters (e.g., cavity length) will provide means for precise cavity coupling and optimized comb operation.

This flexibility in choosing the external cavity parameters allows practical implementation of the disclosed embodiments at a system level. In addition, the external cavity can be realized with as few optical elements as a pair of reflective surfaces and does not involve any modification to the laser devices. Moreover, while simulations can be performed to predict the ideal external cavity condition, the optimization of optical feedback can be performed empirically without extensive laser characterization as is required for most dispersion compensation techniques art the device level. Therefore, embodiments disclosed herein are a cost-effective way to enable comb operation for otherwise non-dispersion-compensated laser devices.

Embodiments of the disclosed invention include an addition to a laser device that allows for more robust operation of laser frequency combs 10, which can include an interband cascade laser or a quantum cascade laser as nonlimiting examples. The addition is an external cavity, which includes either one or several reflective/transmissive surfaces (apart from the laser facet). Part of the light emitted from the comb 10 is resonant with the external cavity and re-injected into the laser. Since this light has been filtered by the low dispersion external cavity before re-injection, the laser favors low phase-noise operation, which enhances the usability of the comb.

Figure 1B:
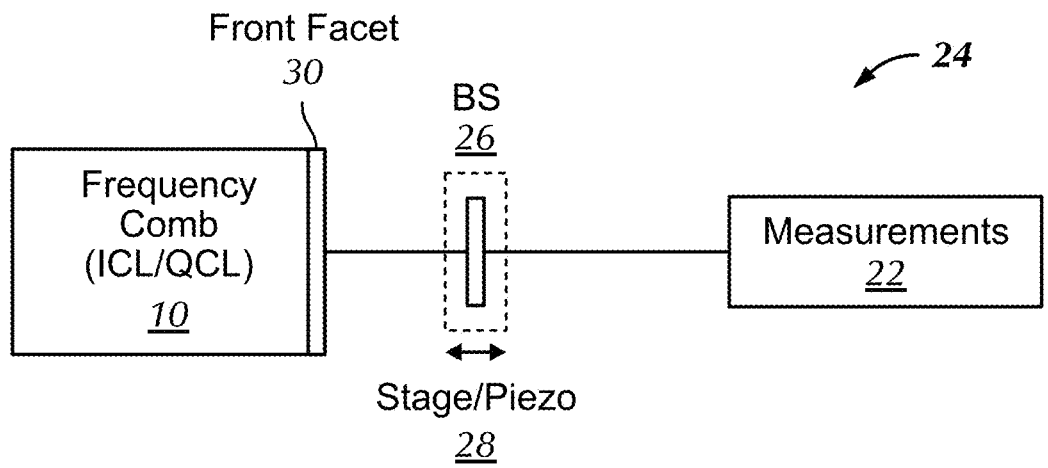
FIG. 1(b) depicts a diagram of frequency comb operation with controlled optical feedback allowing for maximum feedback power according to an embodiment of the present invention.

Two exemplary implementations of this approach are shown in FIGS. 1(a) and 1(b). In FIG. 1(a), the external cavity 12 includes a beam-splitter 14 (which could also be a polarizing beam-splitter), a polarizer 16 (for optical feedback rate control) and a mirror 18 mounted on a translational stage or piezo 20 (for cavity length adjustments). This configuration allows for fine tuning of the intensity of the optical feedback without affecting the main laser output (from the semiconductor laser frequency comb chip 10 with two laser facets, including a first front facet 30 and a second rear facet 31, forming the laser chip cavity 32) that can be used as the coherent source for measurements 22, such as for tunable laser absorption spectroscopy, or for intermode beat note measurements.

Fine tuning of the feedback intensity is performed through rotation of the polarizer 16. A power meter can be placed after the polarizer 16 and before the feedback mirror 18 to measure the transmission as a function of the polarizer rotation angle. By measuring the intermode beat note of the comb while rotating the polarizer 16, the optimal feedback strength can be determined by noting the polarizer angle that results in the narrowest intermode beat note.

FIG. 1(b) depicts a simplified version, where an external cavity 24 includes a partially reflective element 26 (e.g., a window or a beam-splitter) that is used to form the external cavity 24 together with the translational stage or piezo 28 and laser facet 30. Here, the rate of feedback will be controlled by the coating of the partially reflective element 26. The Fresnel reflection from a zinc selenide window, for example, can range from 30% for the coated window surface to <1% for an anti-reflection coated surface. This latter solution requires determination of the optimal optical feedback intensity needed for stable comb operation, whether through experimental means as explained in relation to FIG. 1(a) or through calculations based on comb dispersion data, after which the surface coating of the partially reflective element 26 is configured to meet the required reflection.

While pre-characterization is required for this implementation, it might be preferred compared to the implementation in FIG. 1(*a*) from a manufacturing perspective due to its simplicity. Once the surface coating of the partially reflective element 26 is configured, the distance between 26 is adjusted with respect to the laser facet 30. The intermode beat note can be monitored during this adjustment process to experimentally determine the best placement position of partially reflective element 26 that results in the narrowest intermode beat note. This setup then remains stationary for any spectroscopic measurements using the laser output transmitted through the partially reflective element 26.

Other forms of external cavities (e.g., high finesse cavities, V-shaped cavities) can be implemented as well depending on the application. The external cavity elements may also be coated with custom optical coatings depending on the embodiment. Custom coatings can be optical thin film coatings that tailor reflectivity of the optical interfaces. Examples include anti-reflection coatings (AR coatings), high-reflection coatings (HR coatings), or a custom reflectivity coating that can be used to increase reflectivity at some optical wavelengths while decrease reflectivity at others. They can be used to tailor optical feedback of the external cavity for an optimum compensation of dispersion of a laser frequency comb.

Figure 2A:
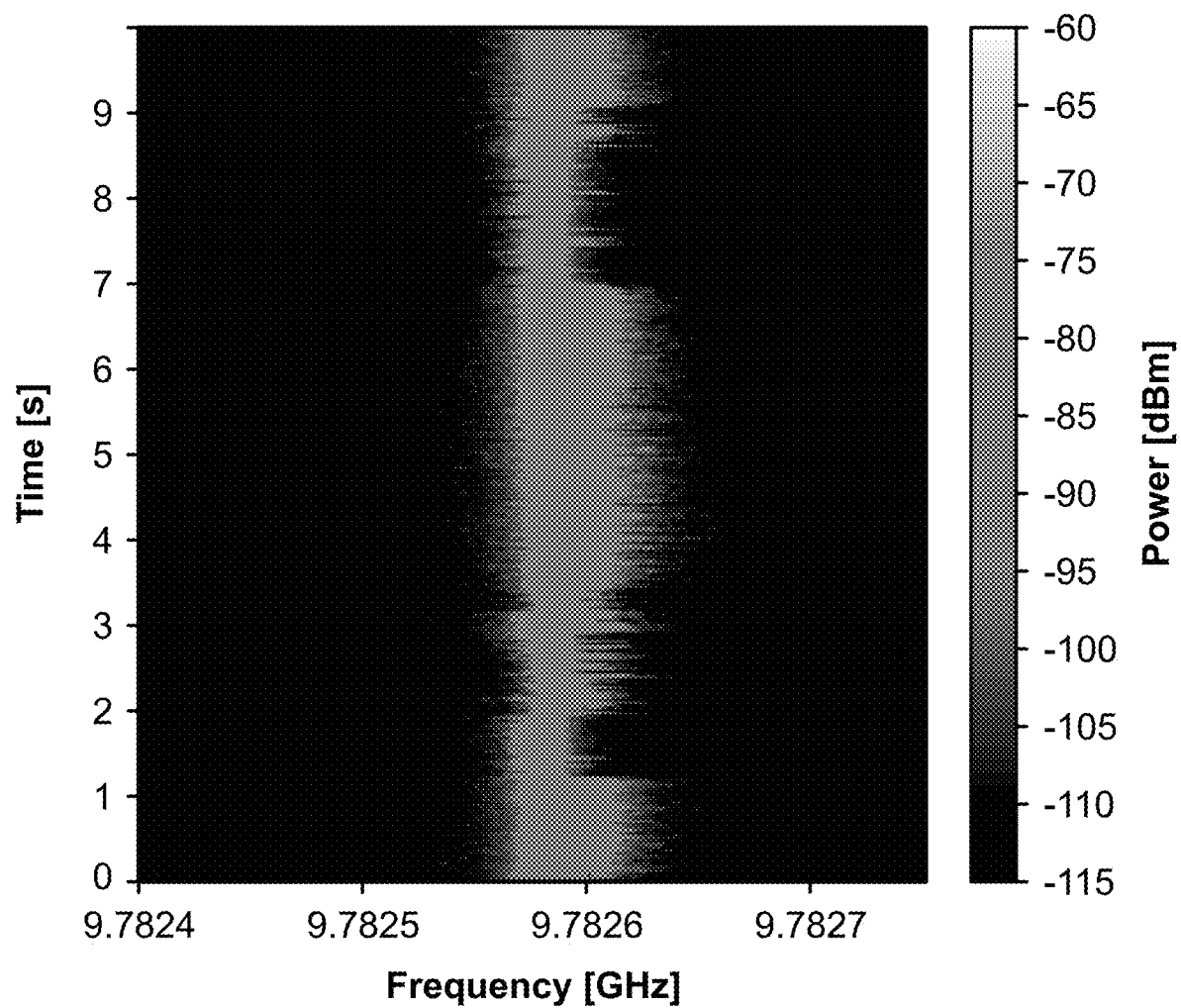
FIG. 2(a) depicts a graph of intermode beat note stability compromised by unwanted feedback from the optical setup.
Figure 2B:
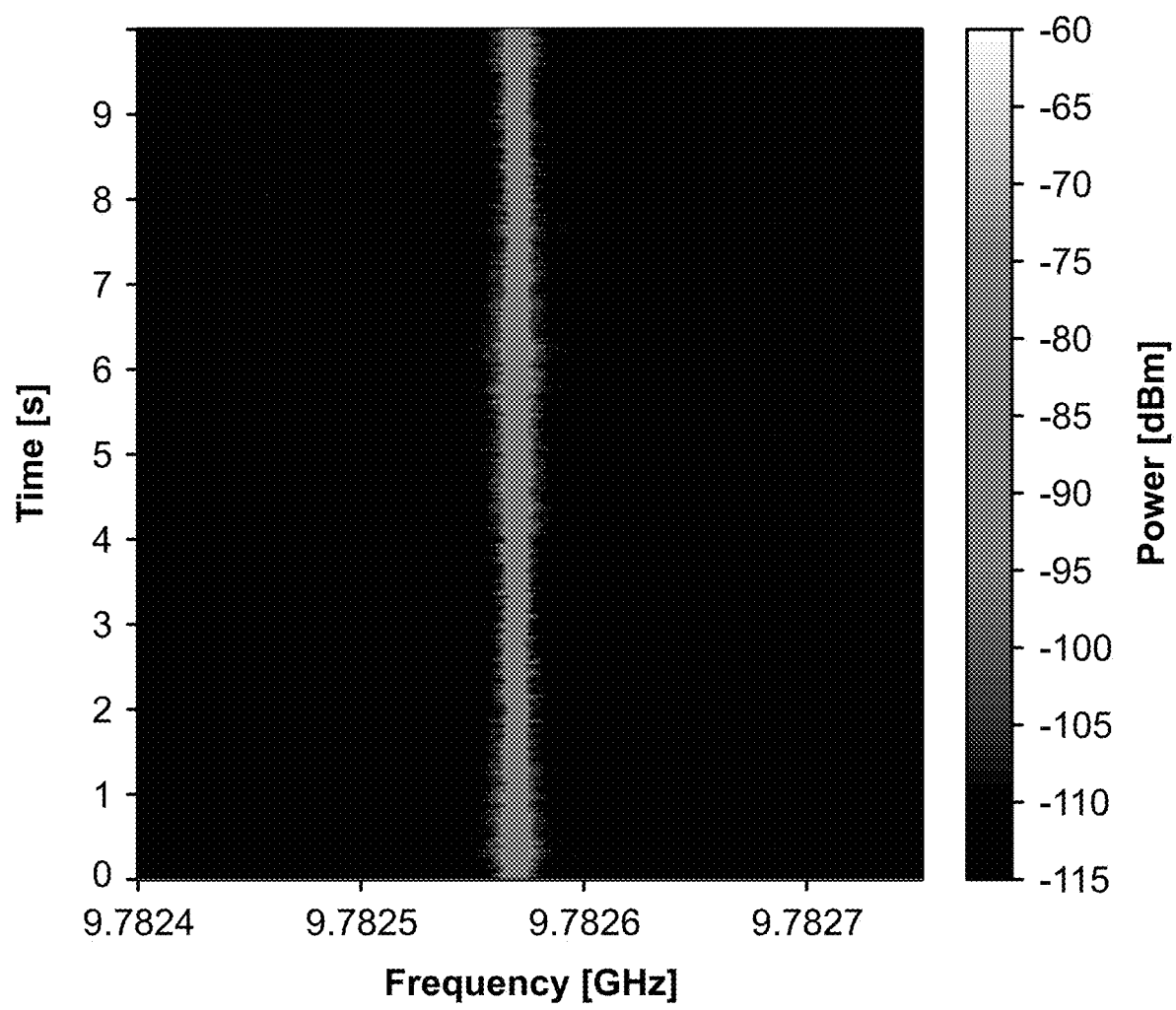
FIG. 2(b) depicts a graph of improved stability of intermode beat note in the presence of unwanted feedback after introducing controlled optical feedback according to an embodiment of the present invention.

In semiconductor (e.g., quantum- or interband-cascade laser) frequency combs, a narrow intermode beat note indicating comb operation can be measured by electrical means (e.g., using a bias-T to isolate the high frequency oscillation from the current supply leads, or an antenna to pick up electromagnetic radiation produced by the frequency comb at its intermode beat note frequency). FIG. 2(*a*) shows the intermode beat note that fluctuates as a function of time in a laser perturbed by unwanted optical feedback. This unwanted feedback could originate from any optical surface in the system capable of reflecting light back into the laser and gives rise to highly unstable behavior of the laser comb, which is here reflected by the widening and fluctuations of the intermode beat note. This phenomenon is widely acknowledged and requires careful configuration of the optical systems, with motor-controlled rotating polarizers, neutral density filters, and variable apertures inserted at strategic positions to limit this parasitic effect. However, when the developed technique based on a controlled optical feedback is applied to the laser, the intermode beat note clearly narrows and stable comb operation is obtained as illustrated in FIG. 2(*b*). The system is now less susceptible to other sources of optical feedback hence less effort to minimize these are needed.

Figure 3A:
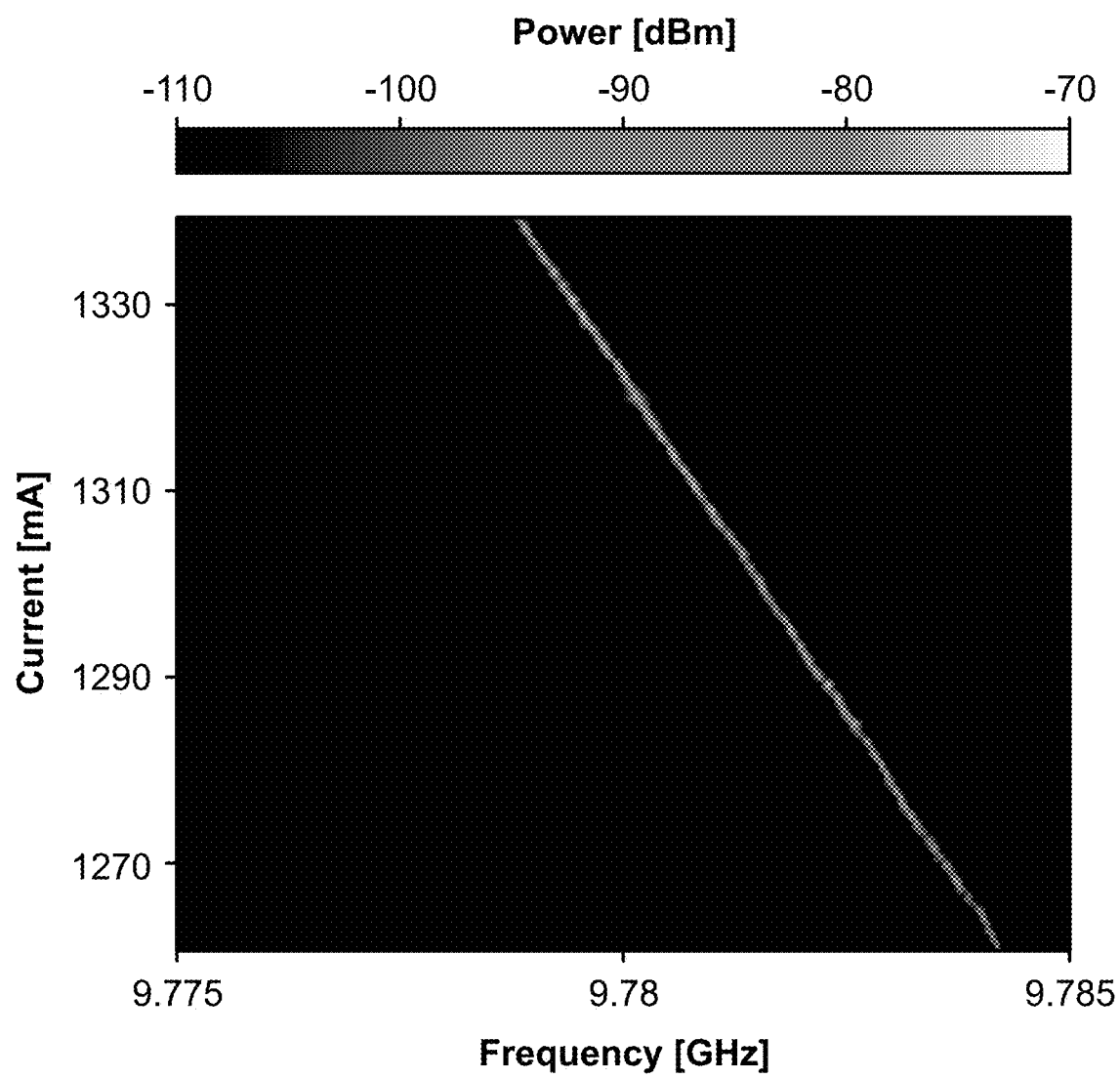
FIG. 3(a) depicts a graph of the intermode beat note spectra with controlled optical feedback as the quantum cascade laser current is incremented according to an embodiment of the present invention.
Figure 3B:
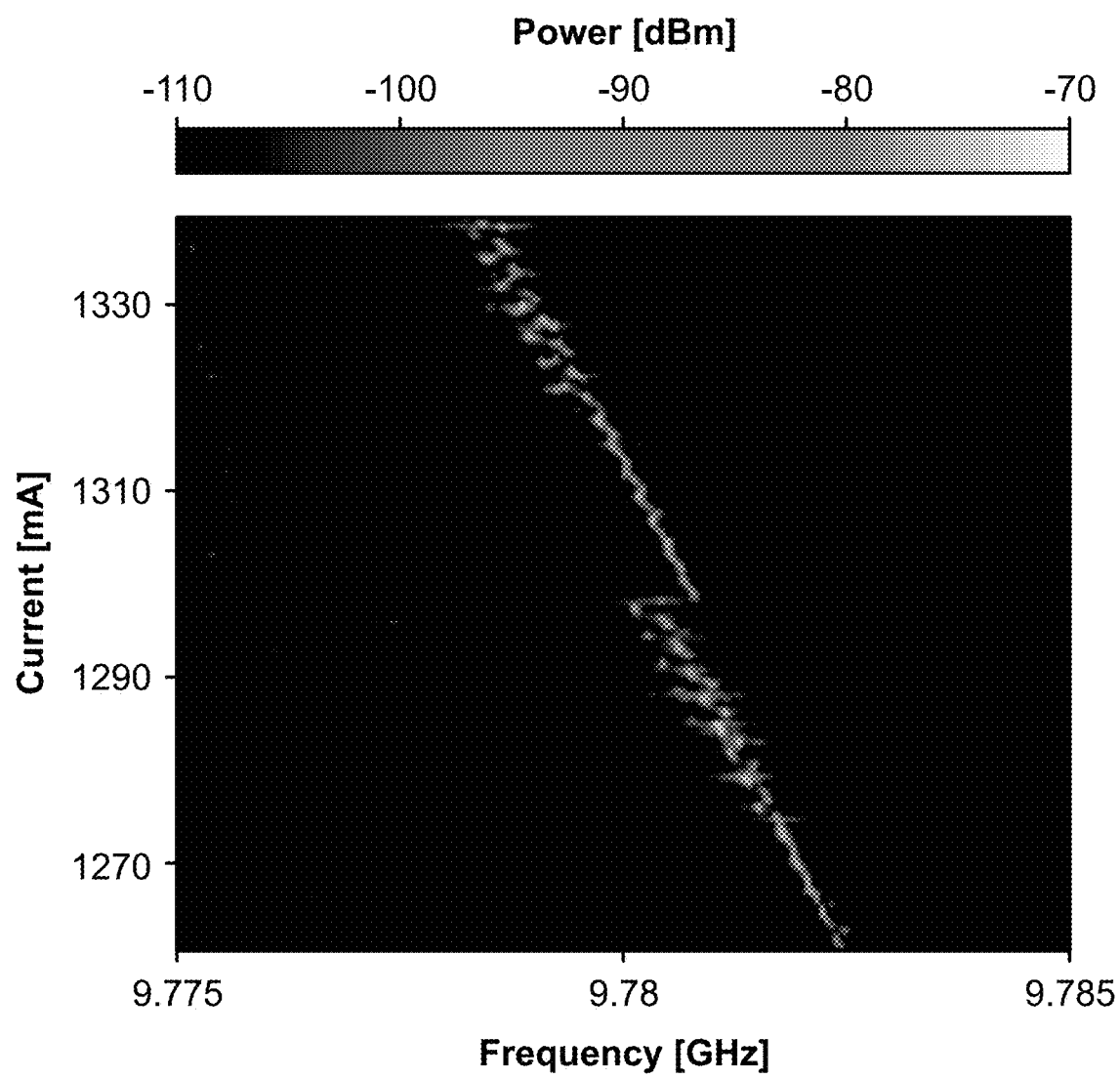
FIG. 3(b) depicts a graph of the intermode beat note spectra without optical feedback as the quantum cascade laser current is incremented.
Figure 3C:
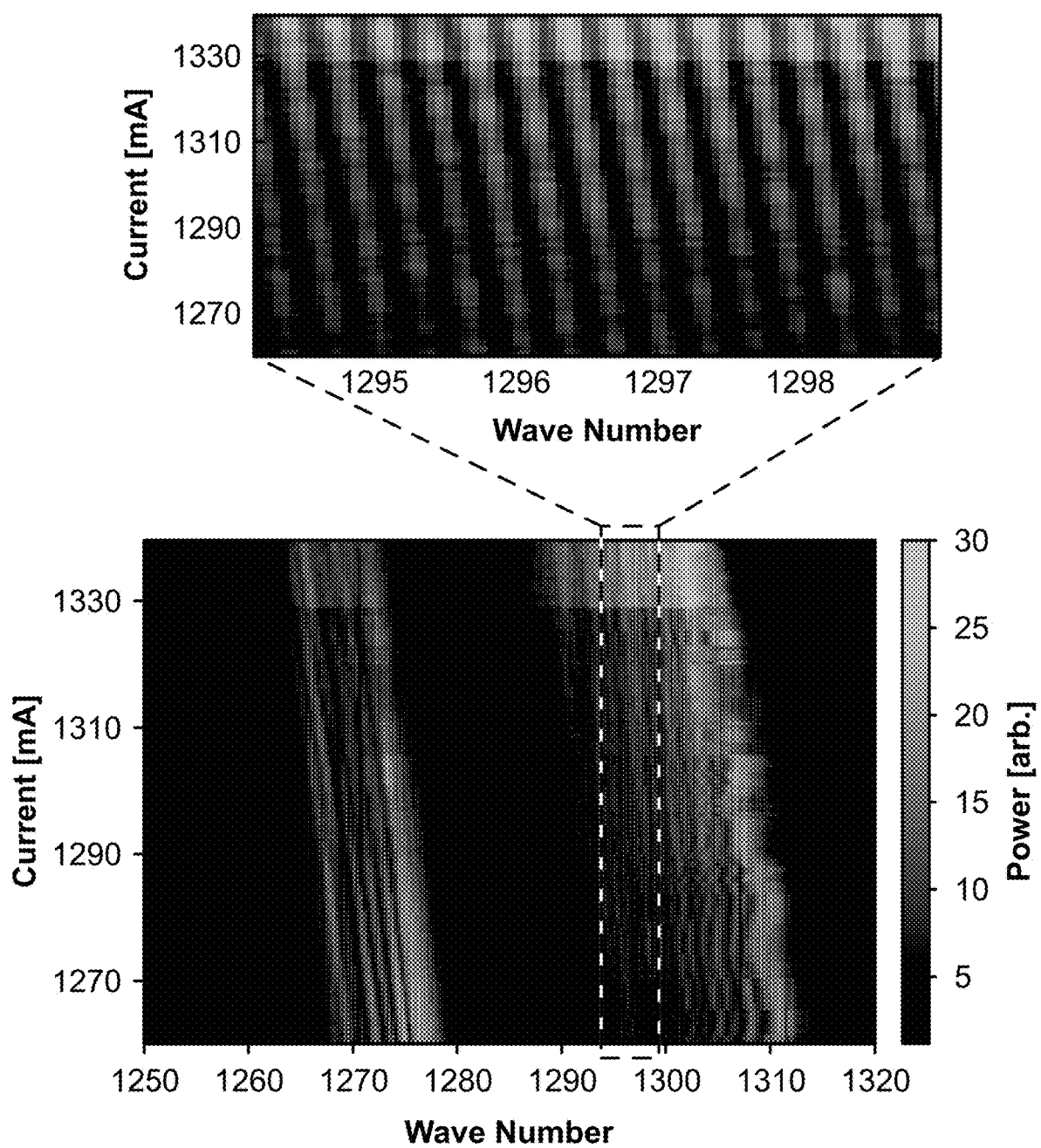
FIG. 3(c) depicts a graph of corresponding Fourier transform infrared spectrometer (FTIR) spectra in a stable comb operation scenario where a small section of the FTIR spectra is enlarged to demonstrated continuous optical mode tuning in response to laser current increase according to an embodiment of the present invention.

In FIGS. 3(*a*)-(*c*), the effects of frequency tuning via the injection current is shown. In FIG. 3(*a*), the intermode beat note is shown as a function of injection current when the external cavity provides appropriate optical feedback (the external cavity length is synchronously varied). Highly linear behavior is observed without any regions that would indicate a loss of comb operation. In contrast, FIG. 3(*b*) shows the intermode beat note without the controlled optical feedback. As can be seen, the beat note width varies and regions with a wide beat note start to appear, indicating a loss of comb properties. FIG. 3(*c*) shows the tuning of modes measured by a Fourier transform infrared spectrometer (FTIR) when using the external cavity optical feedback. The modes tune linearly over the current range measured.

As such, embodiments generally disclosed herein depict a system and method to extend the operating range of semiconductor laser frequency combs by means of external optical feedback. An external cavity is constructed by adding at least one partially reflective surface to the configuration, which, together with a laser facet, forms an external optical resonator that is coupled to the laser cavity. This can strongly favor low phase-noise operation of the semiconductor laser frequency comb, which stabilizes frequency comb operation and allows access to bias and temperature regions previously prone to high phase noise.

It is understood that the above-described embodiments are only illustrative of the application of the principles of the present invention. The present invention may be embodied in other specific forms without departing from its spirit or essential characteristics. All changes that come within the meaning and range of equivalency of the claims are to be embraced within their scope. Thus, while the present invention has been fully described above with particularity and detail in connection with what is presently deemed to be the most practical and preferred embodiment of the invention, it will be apparent to those of ordinary skill in the art that numerous modifications may be made without departing from the principles and concepts of the invention as set forth in the claims.

What is claimed is:

1. A system for stabilizing operation of semiconductor laser frequency combs, comprising:
    a semiconductor laser frequency comb chip with two laser facets forming a laser chip cavity;
    an external cavity having a beam-splitter, polarizer, and mirror, where the mirror is mounted on a translational stage that can adjust external cavity length;
    wherein a free spectral range of the laser chip cavity is an integer multiple of a free spectral range of the external cavity;
    wherein from at least one of the laser facets (a "front laser facet"), broadband comb radiation is emitted;
    wherein the external cavity and the front laser facet form an external optical resonator for coupling to the laser chip cavity; and
    wherein the external cavity reflects a range of optical frequencies emitted from the front laser facet.

2. The system of claim 1, wherein the semiconductor laser frequency comb chip comprises a quantum cascade laser, an interband cascade laser, or a diode laser.

3. The system of claim 1, wherein the laser chip cavity is coupled to the external optical resonator.

4. The system of claim 1, wherein a length of the external cavity is determined by a maximum dispersion of the semiconductor laser frequency comb chip and reflectivity of the two laser facets.

5. The system of claim 1, wherein an optical feedback of the external cavity is tailored for compensation of dispersion of the semiconductor laser frequency comb chip.

6. The system of claim 1, wherein cavity coupling and comb operation are determined by at least one of opto-mechanical, electro-optical, and acousto-optical tuning of parameters of the external cavity.

7. A system for stabilizing operation of semiconductor laser frequency combs, comprising:
    a semiconductor laser frequency comb chip with two laser facets forming a laser chip cavity;
    an external cavity having at least one partially reflective surface mounted on a translational stage that can adjust external cavity length;
    wherein a free spectral range of the laser chip cavity is an integer multiple of a free spectral range of the external cavity;

wherein from the external cavity and at least one of the laser facets (a "front laser facet") emits frequency comb radiation;

wherein the external cavity and the front laser facet form an external optical resonator for coupling to a laser chip cavity; and wherein the external cavity reflects a range of optical frequencies emitted from the front laser facet.

8. The system of claim 7, wherein the semiconductor laser frequency combs comprise a quantum cascade laser, an interband cascade laser, or a diode laser.

9. The system of claim 7, wherein the laser chip cavity coupled to the external optical resonator.

10. The system of claim 7, wherein an external cavity length is determined by a maximum dispersion of the semiconductor laser frequency comb chip and reflectivity of the laser facet.

11. The system of claim 7, wherein the external cavity comprises multiple external cavity elements to tailor an optical feedback of the external cavity for compensation of dispersion of a semiconductor laser frequency comb.

12. The system of claim 11, wherein the multiple external cavity elements comprise at least one of dielectric mirrors, metallic mirrors, lenses, diffraction gratings, prisms, and polarization optics.

13. The system of claim 11, wherein the multiple external cavity elements are coated with custom optical coatings.

14. The system of claim 7, wherein cavity coupling and comb operation are determined by at least one of opto-mechanical, electro-optical, and acousto-optical tuning of parameters of the external cavity.

* * * * *